US007101443B2

(12) United States Patent
Ramachandrarao

(10) Patent No.: US 7,101,443 B2
(45) Date of Patent: Sep. 5, 2006

(54) SUPERCRITICAL CARBON DIOXIDE-BASED CLEANING OF METAL LINES

(75) Inventor: Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 10/353,409

(22) Filed: Jan. 29, 2003

(65) Prior Publication Data

US 2004/0147419 A1 Jul. 29, 2004

(51) Int. Cl.
*H01L 21/461* (2006.01)

(52) U.S. Cl. ............................ 134/34; 134/3; 510/175; 252/79.4

(58) Field of Classification Search ................ 510/175, 510/176, 177; 438/692, 693; 252/79.1, 252/79.2, 79.3; 134/2, 3, 1.3; C11D 7/50
See application file for complete search history.

(56) References Cited

U.S. PATENT DOCUMENTS 5,639,910 A * 6/1997 Ikariya et al. .............. 562/609
5,789,027 A * 8/1998 Watkins et al. ............. 427/250
6,149,828 A * 11/2000 Vaartstra ...................... 216/57
6,277,753 B1 * 8/2001 Mullee et al. .............. 438/692
6,521,466 B1 * 2/2003 Castrucci ....................... 438/5
6,669,785 B1 * 12/2003 DeYoung et al. .............. 134/3
6,743,078 B1 * 6/2004 McClain et al. .............. 451/41
6,764,552 B1 * 7/2004 Joyce et al. .................... 134/3
2003/0125225 A1 * 7/2003 Xu et al. .................... 510/175

OTHER PUBLICATIONS

Kondoh, E.;Microprocesses and Nanotechnology Conference, 2003. Digest of Papers. 2003 International; Oct. 29-31, 2003 pp. 42-43; Digital Object Identifier 10.1109/IMNC.2003.1268509.*

* cited by examiner

*Primary Examiner*—Gregory Webb
(74) *Attorney, Agent, or Firm*—Trop, Pruner & Hu, P.C.

(57) ABSTRACT

Supercritical carbon dioxide may be utilized to clean metal lines (e.g. copper, cobalt). The supercritical carbon dioxide cleans may include hydrogen gas in one embodiment, hydrofluoric acid in another embodiment, and hexafluoroacetyl acetone as a metal-binding ligand in another embodiment.

11 Claims, 1 Drawing Sheet

SUPERCRITICAL CARBON DIOXIDE-BASED CLEANING OF METAL LINES

BACKGROUND

This invention relates generally to processes for manufacturing semiconductor integrated circuits.

In a variety of processes, metal lines may be formed. For example in conjunction with a damascene process, copper lines may be formed. Copper has many performance advantages over conventional aluminum interconnects.

Metallic copper a high tendency to become oxidized when exposed to strong acids or water at elevated temperatures. Copper forms oxides with difference oxidation states like $Cu_2O$ and CuO. Normally, hydrogen-plasma based cleans are used in the industry. But, more delicate dielectric materials (ILD) preclude the use of this technique due to the deleterious effect of the hydrogen plasma on the ILD properties and the dielectric constant of the ILD.

In the dual-damascene process, a copper line may exist at the bottom of a via trench through a dielectric material with a layer of metal oxide as a result of the cleans and other etch residue on its top surface. These copper oxides at the top of the exposed trench copper need to be removed or reduced back to metallic copper to form lower electrical resistance metal lines and connecting vias.

Thus, there is a need for better ways to clean metal lines and especially to clean metallic lines that are subject to oxide formation without damaging the properties of the delicate dielectric material.

DETAILED DESCRIPTION

Supercritical carbon dioxide has gas-like diffusivity and viscosity and liquid-like densities, while being almost chemically inert. Hence a host of chemically reactive agents may almost always be used in conjunction during supercritical carbon dioxide-based removal of photoresist, antireflective coating and plasma etch residue. Carbon dioxide becomes supercritical at temperatures above its critical pressure and temperature.

In accordance with one embodiment of the present invention, metal lines, formed by any process, including the via first process for example, may be cleaned using hydrogen, hexafluoroacetyl acetone or other organic precursors that can act as ligands to metal atoms for its removal as needed, and dilute hydrofluoric acid (mixed with water or other alcohols or other organic solvents) dissolved or suspended in supercritical carbon dioxide to remove metal oxides and other organics attached to exposed metal. The supercritical carbon dioxide-based cleaning of the photoresist and any antireflective coating discussed above may be followed by supercritical carbon dioxide-based in situ metal cleaning (or can be used even after conventional liquid-based cleans).

The use of dilute hydrofluoric acid removes copper oxide at the via bottom in an embodiment involving copper lines. The use of hexafluoroacetyl acetone removes $Cu_2O$ from via sidewalls and has good solubility in supercritical carbon dioxide in its native form and even when it is coordinated to the metal atom (e.g. $Cu_x(hfac)_y$).

The introduction of hydrogen atoms into the metal (or its oxide) from hydrogen gas mixed with supercritical carbon dioxide, rather than via the currently used hydrogen plasma, allows hydrogen diffusion and reduction of $Cu_2O$ at via bottoms. At the same time, the exposure of the copper to ambient air may be avoided if the cleaning of the metal occurs in the enclosed high-pressure carbon dioxide chamber, reducing the possibility of needless oxidation that the metal is prone to undergo.

Metals, such as copper and cobalt, have a high tendency to oxidation when exposed to strong acids or water at elevated temperature. Copper forms oxides with different oxidation states like $Cu_2O$ and CuO. These oxides, at the top of an exposed trench, may be reduced back to metallic copper to have lower electrical resistance. While copper is discussed in the following example, the present invention may be applicable to cleaning other metals as well, including cobalt that can be used as a shunt for reducing electromigration effects.

Figure 1:
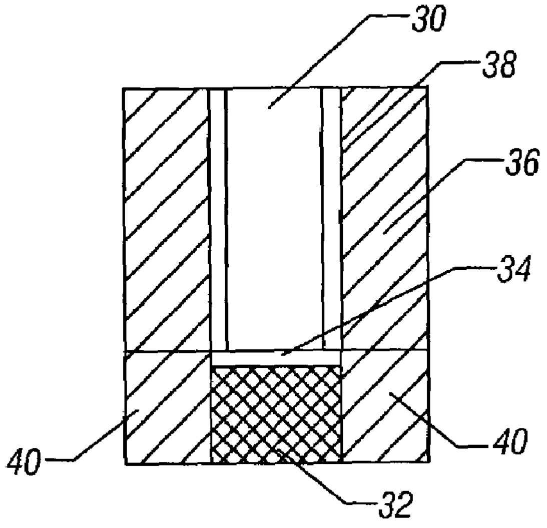
FIG. 1 is an enlarged, partial cross-sectional view of another embodiment of the present invention.

Referring to FIG. 1, a copper line 32 may be formed, for example, in a via between dielectric material 40. An interlevel dielectric layer 36 (36 may be the same as 40) having a via 30 may be positioned over the copper line 32. Various copper oxides may be formed at the via 30 bottom, as indicated at 34, including $Cu_2O$ and CuO, as well as etch residue containing C, H, and F, and along the via 30 sidewalls, as indicated at 38.

Generally the etch process and cleaning process leave carbon, hydrogen, oxygen, and fluorine, as indicated at 34, on the bottom of the via 30 or over the copper line 32 surface. Dilute hydrofluoric acid may be used to remove carbonaceous material at near ambient temperatures. The dilute hydrofluoric acid may be supplied as a solution or suspension in flowing supercritical carbon dioxide.

The next step may involve the removal of sputtered copper and compounds thereof, indicated as 38, from the via 30 sidewalls and inside the interlayer dielectric 30 from both the etch and clean processes. Hexafluoroacetyl acetone has good solubility in supercritical carbon dioxide. The use of supercritical carbon dioxide as a carrier for the hexafluoroacetyl acetone decreases reliance on the vapor pressure of hexafluoroacetyl acetone or other low vapor pressure precursors and allows increased concentration of hexafluoroacetyl acetone for desired the chemical reaction with metal and/or its compounds.

Figure 2:
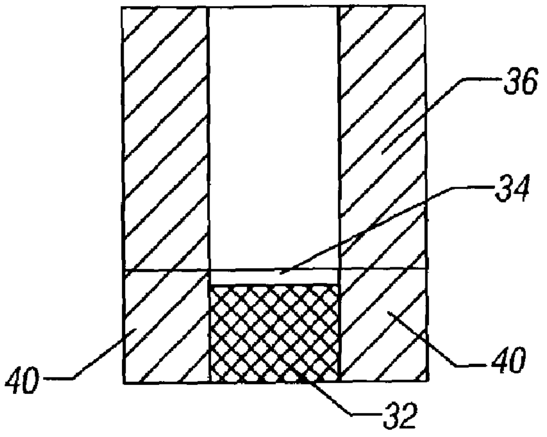
FIG. 2 is an enlarged cross-sectional view of the embodiment shown in FIG. 1 after further processing.

The use of relatively lower temperature supercritical carbon dioxide also results in decreased exposure time of the wafer to elevated temperatures, which normally leads to diffusion of copper into the interlevel dielectric. The use of hexafluoroacetyl acetone may also lead to carbon, hydrogen, and fluorine contamination on the via 30 bottom. Thus, this step predominantly is used to remove copper from the sidewalls of the via 30 to achieve the structure shown in FIG. 2.

The short exposure of hexafluoroacetyl acetone may necessitate another hydrofluoric clean to remove carbon, hydrogen, and fluorine. The cleans up to this point may not be able to entirely remove the oxides of copper and, in particular, $Cu_2O$ from the bottom of the via 30. The removal of remaining copper oxides may be accomplished using hydrogen gas ($H_2$) mixed with supercritical carbon dioxide. Normally higher temperature hydrogen plasma at temperatures greater than 150° C. is used for this purpose. However, high temperature hydrogen plasma can damage porous interlevel dielectrics, leading to an increase in its dielectric constant.

The purpose of the hydrogen plasma is to generate hydrogen radicals and/or atoms at the $Cu_2O$/air interface. These hydrogen radicals diffuse into the copper/$Cu_2O$ material reducing the $Cu_2O$ from the top of the via 30 bottom. The diffusion of hydrogen atoms through the metal is the rate-limiting step of the metal oxide to metal conversion process.

Figure 3:
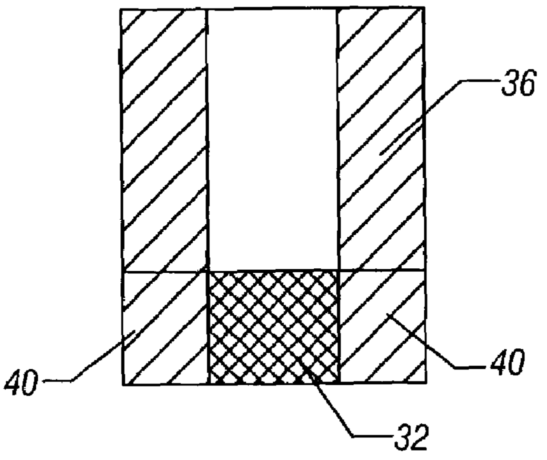
FIG. 3 is an enlarged cross-sectional view of the embodiment shown in FIG. 2 after further processing in accordance with one embodiment of the present invention.

By introducing hydrogen using a mixture of supercritical carbon dioxide and gaseous $H_2$, the resulting hydrogen gas selectively attacks the metal due to its preferential adsorption on the metal/metal oxide interface. As shown in FIG. 3, the resulting structure may include a via substantially free of unwanted deposits.

The copper cleans can all be performed in the same supercritical carbon dioxide tool, in some embodiments, with different chambers at various temperatures. This avoids the need to move the wafer, exposing the copper lines to the ambient atmosphere. Regular cleans can also be added to the carbon dioxide-based cleans, including the removal of photoresist, anti-reflective coating, and etch residue.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

exposing a metallic line on a semiconductor structure to flowing supercritical carbon dioxide including hydrogen gas and hexafluoroacetyl acetone.

2. The method of claim 1 including exposing said structure to flowing supercritical carbon dioxide including hydrofluoric acid.

3. The method of claim 2 including exposing said structure to flowing supercritical carbon dioxide and hydrofluoric acid after exposing said structure to hexafluoroacetyl acetone.

4. The method of claim 1 including exposing said structure to flowing supercritical carbon dioxide including hydrofluoric acid, hexafluoroacetyl acetone, and hydrogen gas.

5. The method of claim 1 including exposing a line including copper and removing copper oxide from a trench sidewall using carbon dioxide and hexafluoroacetyl acetone.

6. The method of claim 1 including removing metal oxide from the bottom of a trench using carbon dioxide and hydrogen gas.

7. The method of claim 1 including cleaning etch residues using supercritical carbon dioxide and then cleaning copper lines using supercritical carbon dioxide.

8. The method of claim 7 including cleaning photoresist and hard crust of photoresist etch residue using supereritical carbon dioxide and an oxidizer.

9. A method comprising:

exposing a metallic line on a semiconductor structure to flowing supercritical carbon dioxide including hydrogen gas; and exposing a line including copper and removing copper oxide from a trench sidewall using carbon dioxide and hexafluoroacetyl acetone.

10. The method of claim 9 including exposing said structure to flowing supercritical carbon dioxide including hexafluoroacetyl acetone.

11. The method of claim 10 including exposing said structure to flowing supercritical carbon dioxide and hydrofluoric acid after exposing said structure to hexafluoroacetyl acetone.

* * * * *